(12) United States Patent
Kuang et al.

(10) Patent No.: US 7,545,690 B2
(45) Date of Patent: Jun. 9, 2009

(54) METHOD FOR EVALUATING MEMORY CELL PERFORMANCE

(75) Inventors: Jente B. Kuang, Austin, TX (US); Jerry C. Kao, Ann Arbor, MI (US); Hung Cai Ngo, Austin, TX (US); Kevin J. Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 11/741,187

(22) Filed: Apr. 27, 2007

(65) Prior Publication Data

US 2008/0130387 A1    Jun. 5, 2008

Related U.S. Application Data

(62) Division of application No. 11/250,061, filed on Oct. 13, 2005, now Pat. No. 7,349,271.

(51) Int. Cl.
  *G11C 7/00* (2006.01)
  *G11C 11/00* (2006.01)
(52) U.S. Cl. ................................ 365/201; 365/154
(58) Field of Classification Search ................ 365/154, 365/201, 203, 194
  See application file for complete search history.

(56) References Cited

U.S. PATENT DOCUMENTS

| | | | |
|---|---|---|---|
| 5,781,469 A * | 7/1998 | Pathak et al. ............... | 365/156 |
| 6,452,459 B1 | 9/2002 | Chan et al. | |
| 6,958,659 B2 | 10/2005 | Nakajima | |
| 7,071,736 B2 | 7/2006 | Wikstrom | |
| 7,190,233 B2 | 3/2007 | Bhushan et al. | |
| 7,376,001 B2 * | 5/2008 | Joshi et al. ............... | 365/154 |
| 2004/0061561 A1 | 4/2004 | Monzel et al. | |

(Continued)

FOREIGN PATENT DOCUMENTS

JP   09294055 A   11/1997

OTHER PUBLICATIONS

U.S. Appl. No. 11/609,598, filed Dec. 12, 2006, Ehrenreich, et al.

(Continued)

*Primary Examiner*—Richard Elms
*Assistant Examiner*—Douglas King
(74) *Attorney, Agent, or Firm*—Mitch Harris, Atty at Law, LLC; Andrew M. Harris; Casimer K. Salys

(57) ABSTRACT

A method for evaluating memory cell performance provides for circuit delay and performance measurements in an actual memory circuit environment. A row in a memory array is enabled along with a set of drive devices that couple each bitline pair to the next in complement fashion to form a cascade of memory cells. The drive devices can be inverters and the inverters can be sized to simulate the bitline read pre-charge device and the write state-forcing device so that the cascade operates under the same loading/drive conditions as the operational with memory cell read/write circuits. The last and first bitline in the row can be cascaded, providing a ring oscillator or the delay of the cascade can be measured in response to a transition introduced at the head of the cascade. Weak read and/or weak write conditions can be measured by selective loading.

8 Claims, 5 Drawing Sheets

U.S. PATENT DOCUMENTS

2005/0063232 A1 3/2005 Chan et al.
2005/0078508 A1 4/2005 Chan et al.
2005/0204211 A1 9/2005 Gouin et al.
2006/0050600 A1 3/2006 Venkatraman et al.
2006/0097802 A1 5/2006 Chan et al.
2007/0086232 A1 4/2007 Joshi et al.

OTHER PUBLICATIONS

U.S. Appl. No. 11/682,542, filed Mar. 6, 2007, Carpenter, et al.
U.S. Appl. No. 11/781,994, filed Jul. 24, 2007, Kuang, et al.

* cited by examiner

METHOD FOR EVALUATING MEMORY CELL PERFORMANCE

CROSS-REFERENCE TO RELATED APPLICATION

The present application is a Divisional Application of U.S. Patent Application: "CASCADED TEST CIRCUIT WITH INTER-BITLINE DRIVE DEVICES FOR EVALUATING MEMORY CELL PERFORMANCE", Ser. No. 11/250,061, filed on Oct. 13, 2005 now U.S. Pat. No. 7,349,271.

This invention was made with government support under PERCSII, DARPA NBCH3039004. THE GOVERNMENT HAS CERTAIN RIGHTS IN THIS INVENTION.

BACKGROUND OF THE INVENTION

1. Technical Field

The present invention relates generally to memory circuit test methodologies and more particularly to a memory array test using cascaded bitlines.

2. Description of the Related Art

Memory speed and other performance factors are critical limitations in today's processing systems and are predicted to become even more of a critical limitation as technologies move forward. In particular, static random access memories (SRAMS) and memory cells are used in processor caches, registers and in some designs external to the system processors for fast access to data and program instructions.

With processor cycle frequencies reaching well above 4 Ghz, development of SRAM cells that can store and provide access to stored values within that period has become necessary. However, measuring operating performance of memory cells in the presence of actual loading conditions presents a challenge.

Memory cell transition times, along with many other digital circuits have been evaluated using ring oscillator circuits wherein a large number of cells are cascaded with feedback of the output arranged in a ring configuration. The frequency at which the ring oscillator operates indicates the transition time performance, which provides some measure of ultimate operating frequency and access times. Typically, the cell design is then changed in subsequent design iterations having parameters adjusted in response to the results of the ring oscillator test.

However, present ring oscillator circuits and other delay-oriented circuits for performing delay tests typically either are not applied on production dies or they do not test the memory cells under loading conditions identical to placement of the cells within an actual memory array. Since memory arrays are organized in rows and columns, bitlines common to each cell in a column provide loading from the bitline wire (metal) paths as well as the other cells in the column. In order to determine the performance of a memory cell design and process, the bitline loading must be considered and measured.

It is therefore desirable to provide a circuit and method for evaluating memory cell delay performance under operating conditions that are as close to actual bit-line loading conditions as possible. It is further desirable to provide such a test circuit that can be selectively enabled on production dies so that on-going evaluation during the production life span of a memory design can be performed.

SUMMARY OF THE INVENTION

The objective of evaluating memory cell designs under actual bit-line loading conditions via a method using a circuit that can be selectively enabled in a production die.

The circuit is a memory array that incorporates a cascade of memory cells within a row of the array. The number of stages of the cascaded is generally equal to the number of cells within a row. Each stage of the cascaded row is connected to the memory array just as a standard member of the corresponding column, i.e., each cell has its input/output connections coupled to bitlines of a corresponding column, just as in a standard memory array. Other disabled rows may be selectively connected or disconnected at either or both bitlines, in order to study behaviors of cell read and cell write strengths.

Additional drive elements are provided that couple each bitline to the complementary bitline in the next bitline pair to form a delay chain that may be closed from the last column to the first column to form a ring oscillator, including additional enable and/or delay stages as necessary. The delay elements may be inverters and the devices in the inverter may be sized to simulate the drive/loading levels of the write or read device associated with a particular logic transition. By cross-coupling each stage (complement output to true input and vice-versa), the actual read/write conditions on a cell can be exactly duplicated. Other rows of the array are turned off and may be set to different states to simulate various leakage/loading conditions and other rows may be disconnected from one of the bitlines in order to perform the read vs. write analysis mentioned above.

The circuit under test may be a 6 transistor static random access memory SRAM cell with a pair of cross-coupled back-to-back complementary transistor inverters and with a series word/bit-line transmission control transistor between the output of each inverter and the corresponding word/bit-line or the cell may be a different design or different type of memory cell.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a ring oscillator circuit for evaluating performance of memory cells and memory arrays in order to facilitate design improvement and determination of operating margins. In particular, a ring oscillator is implemented in a row of a memory array, which may be a production memory array tested for ongoing product analysis or a test memory array implemented and tested for laboratory analysis. The oscillator row is connected within a memory array just as other rows: the input/output connections of the memory cells in the oscillator row are connected to their corresponding column bitlines. However, additional drive circuits are connected between adjacent complementary bitlines so that a state transition passed from a memory cell to the input of a drive circuit is imposed as a state transition at a next complementary bitline, simulating a write at the next complementary bitline and a read from the memory cell that supplied the transition.

The drive devices can connect the last bitline(s) to the first bitline(s) to form a ring oscillator or a one-shot delay can be measured as a transition is passed from the first bitline to the last. The loading experienced by the cells in the oscillator is identical to that of an ordinary storage row, providing an accurate measure of the delays of the memory cells in an actual memory array implementation. A test die may be implemented that includes the test circuit permanently wired-in-place, or a sacrificial metal can be used to implement the circuit on a production wafer, which can then be modified into an operational memory circuit via a permanent metal layer that replaces the sacrificial layer. The memory array of the present invention may also alternatively be implemented on the wafer kerf and discarded after testing. Alternatively, the ring oscillator or delay measurement circuit can be selectively enabled in a test mode.

Figure 1:
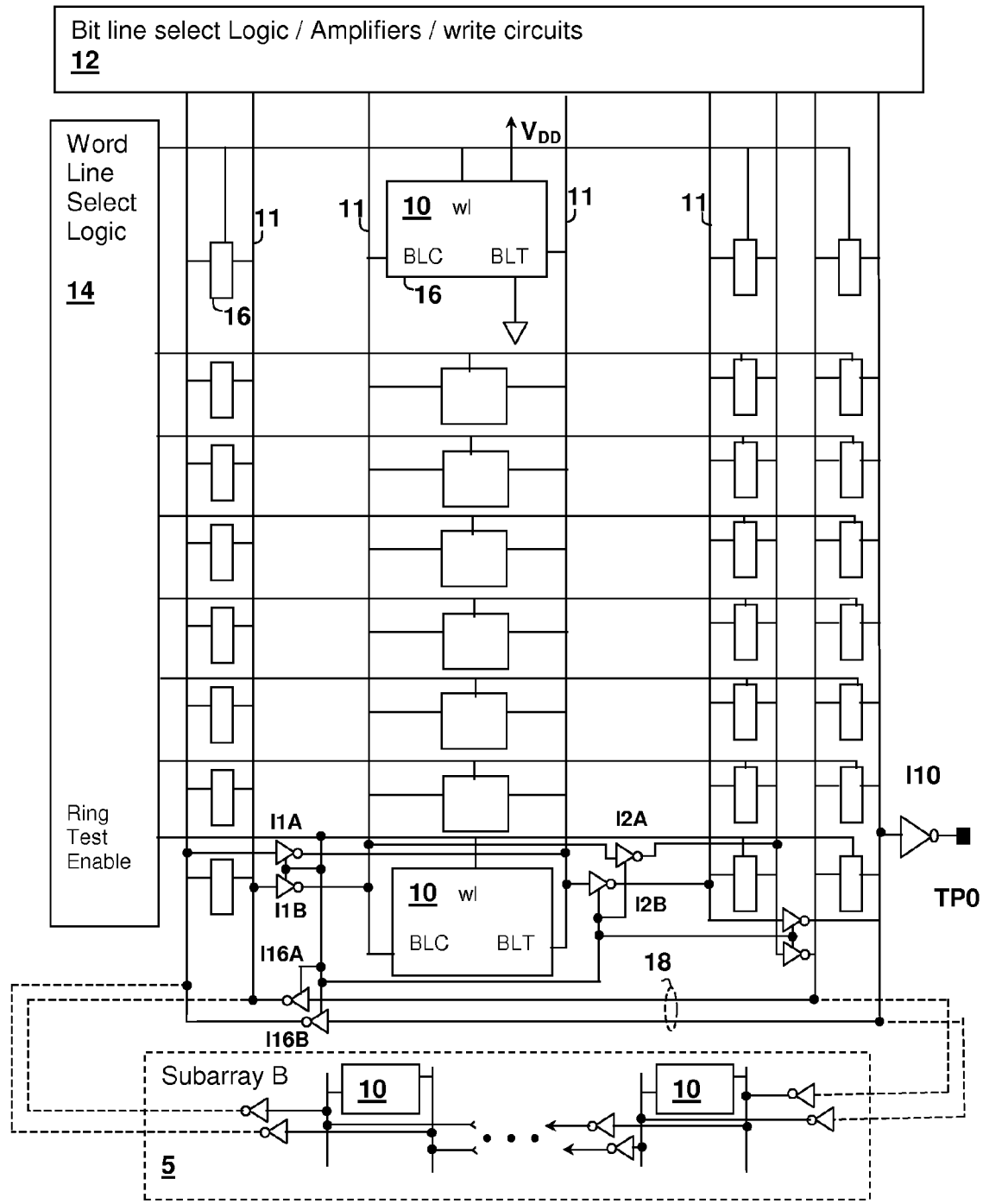
FIG. 1 is a schematic diagram of a memory array in accordance with an embodiment of the invention.

With reference now to the figures, and in particular with reference to FIG. 1, a memory array in accordance with an embodiment of the invention is shown. The memory array includes multiple memory cell columns 16 assembled from memory cells 10 and additionally, at least one test row that is enabled with a ring test enable signal provided from wordline select logic 14. It should be noted that the test row can be an operational row of the memory circuit, as no alteration to the test row memory cells are made. When the test row is enabled via the ring test enable signal, a set of drive devices I1A,B-I16A,B are connected between the column bitlines to form either a ring oscillator, or by omitting the final set of drive devices B16A,B, a one-shot delay line is be implemented. For the ring oscillator implementation, the net state change around the ring should invert the state of the memory cells, so an extra inversion or insertion of a non-inverting stage is needed such as buffer stages B16A,B. Each memory cell 10 acts as an inverter that transfers a value from the "true" bitline and asserts its inverted state on the "complement" bitline and similarly asserts the value of the complement bitline on the true bitline, by virtue of the back to back inverters forming the memory cells 10. Therefore, inverters used as drive devices e.g., I1A,B, result in a net non-inverting change between sequential bitlines due to the inverting nature of the memory cells. The output of the ring oscillator is provided at a test pad TP0 through an inverter I10.

The coupling of drive devices I1A,B-I16A,B from bitline pair to bitline pair is crossed-over from true to complement and vice-versa so that a single ring oscillator is formed rather than two weakly-coupled separate rings. The circuit can be implemented as a "differential" configuration as shown in FIG. 1 or one set of drive devices (devices suffixed "A" or "B" can be omitted, yielding a single-ended embodiment which has some advantages that will be described below with respect to FIG. 4. Each given memory cell 10 in the test row supports propagation of state changes on bitlines 11 of a previous column 16 to the bitlines 11 corresponding to the column 16 of the next memory cell 10 in the test row. Only four stages are shown in the figure for simplicity, but an actual implementation will match the number of memory cells in a row of a production memory array and will generally be much larger.

In order to form a ring oscillator, the last column bitlines 11 are looped back via connections 18 to the last drive device pair I16A,B and the number of columns, polarities of the drive devices, etc. are arranged so that a net logical inversion takes place around the ring. As an alternative, if a second subarray 5 is included in the memory circuit that is essentially the same as the first subarray formed from columns 16 and as described above, subarray 5 can provide the return signal path for the ring. Rather than providing connections 18, which must physically cross a larger distance than the inter-bitline connections, connections 18 and drive device pair I16A,B are omitted and cells within a row of second subarray 5 are connected as described above for the first subarray, so that the connection between the last memory cell 10 of subarray 5 and bitlines 11 of the first column of the first subarray are physically short.

The remainder of the memory array(s) can be made similar to standard memory arrays, with the exception of test logic provided within the control logic to select the ring oscillator/delay line, which enables the common wordline connections as shown from the Ring Test Enable output of a word line select logic and enables drive devices I1A,B-I16A,B. Drive devices I1A,B-I16A,B can be replaced with standard inverters for all but one stage if the test circuit is implemented in a test-only die or production wafer kerf circuit or a sacrificial metal layer is used to enable tests. Otherwise, each of drive devices I1A,B-I16A,B can be implemented with an enable input, so that the entire drive device chain can be decoupled from the memory array and the memory array then operated as a functional memory. Different types of drive devices can be mixed and special enable/startup circuits can be inserted at one or more points in the ring or delay line.

If the memory array is a test-only array, the cells in other rows of a test array may be dummy cells without logic to select them for reading or writing. However, even in test environments, the leakage/loading test methodologies detailed hereinafter below make it desirable to have some means of altering the internal states of memory cells outside of the row of cells 10A that implement the ring oscillator.

Bitlines 11 are also shown connected to a bitline select logic/sense amplifiers/write circuits 12 block that selects the appropriate column output, provides the value of the memory cell to external circuits in response to a memory read operation and sets pairs of bitlines to appropriate states during a write operation. The row is selected by a particular word line asserted from a word line select logic 14. Word line select logic 14 and bitline select logic/sense amplifiers/write circuits 12 are only needed in complete form for operationally functional memory arrays and a test memory array can be constructed without the complete functionality of a production memory array. However, to perform all of the tests that will be described below, the ability to write all memory cells 10 is needed. However, writing can be performed via boundary scan circuits or other techniques that do not require the full read/write access logic of a production static memory array.

To more accurately simulate the actual loading present in the production memory array, each of the output transistors in the inverters/buffers implementing drive devices I1A,B-I16A,B can be sized so that for a bitline logic state corresponding to a pre-charge state, the corresponding drive device output transistor or transistor chain is sized to simulate exactly the pre-charge pull-up device in the production array. Similarly, the opposing transistor or transistor chain in the output stage of drive devices I1A,B-I16A,B can be sized to exactly simulate the write pull-down devices used to discharge one of the bitlines during a write operation. It should also be noted that the supply voltage of drive devices I1A,B-I16A,B, does not have to match that of memory cells 10, permitting the voltage of memory cells 10 to be variably reduced for testing purposes.

Figure 2A:
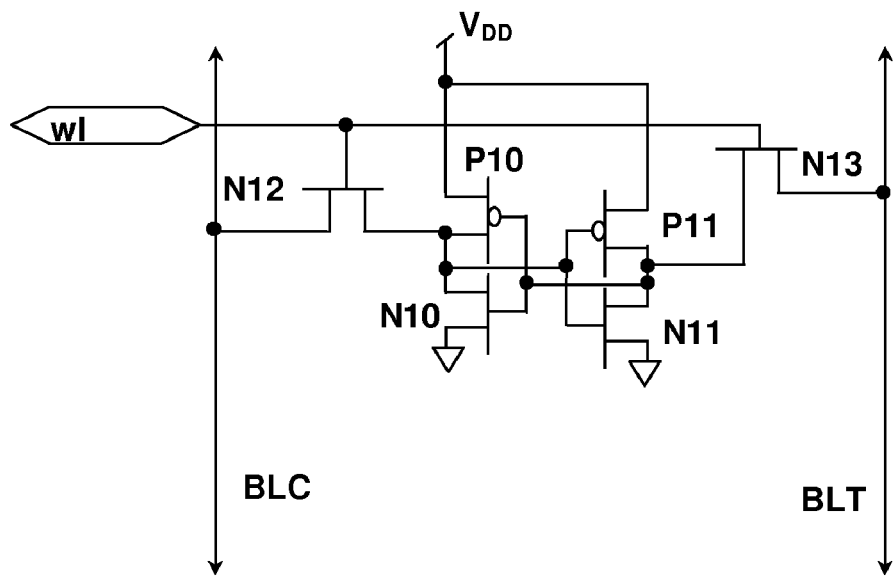
FIGS. 2A-C are a schematic diagram depicting details of various drive devices/startup circuits as can be used to couple bitlines within memory array of FIG. 1.

Referring now to FIG. 2A, details of memory cells 10 of FIG. 1 are shown. Transistors P10, N10, P11 and N11 form a static latch that provides the storage of a value in the cell via a pair of cross-coupled inverter stages. Transistors N10 and P10 form one inverter stage and transistors N11 and P11 form the other inverter stage. Transistors N12 and N13 provide for access to the value in response to a wordline select signal WL, which is asserted for all cells 10 in the ring oscillator/delay line row when the memory array is enabled in test mode. Bitlines BLT (true bitline) and BLC (complement bitline) couple all cells in a column, so that when another row is selected by signal WL, only one row memory cell 10 from each column 16 is exposed to the memory logic. For a normal read operation, the bitlines BLC and BLT are previously charged to opposite state predetermined voltages (generally $V_{DD}$ and ground), and to commence the read, WL is pulsed and a sense amplifier coupled to bitlines BLC and BLT determines the stored state by differential comparison of bitlines BLC and BLT. While the illustrated cell is an example of a cell of order 4 that may be analyzed and improved by a method according to an embodiment of the invention, it should be understood that the ring oscillator row measurement illustrated herein may be applied to memory cells of other order or type.

Figure 2B:
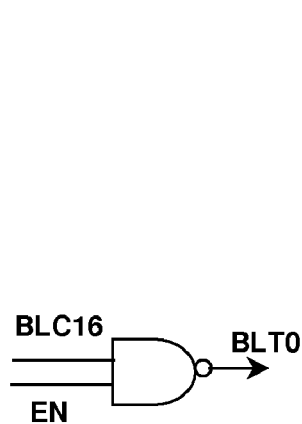

FIG. 2B shows a startup circuit that may be used to supply a startup drive device in the circuit of FIG. 1. A logical NAND gate provides a logical low output on the first "true" bitline BLT0, when the enable signal EN is asserted. The logical low value then propagates to the end of the array (the last column) and returns to the NAND gate as input BLC16, which changes the state of BLT0 to support oscillation. If only a delay line implementation is used, then the input of the NAND gate shown as connected to BLC16 can be connected to $V_{DD}$.

Figure 2C:
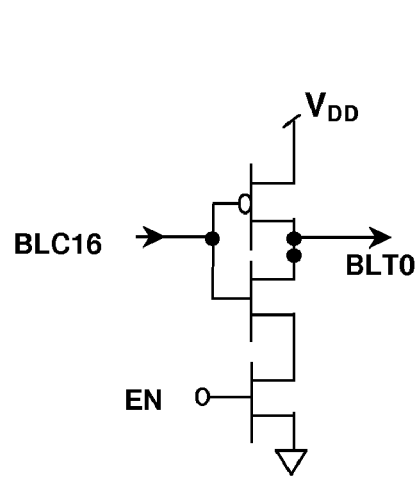

FIG. 2C shows an alternative start-up circuit that consists of an inverter with a "foot" device that disables the low-going output rail until the EN signal is asserted.

Figure 2D:
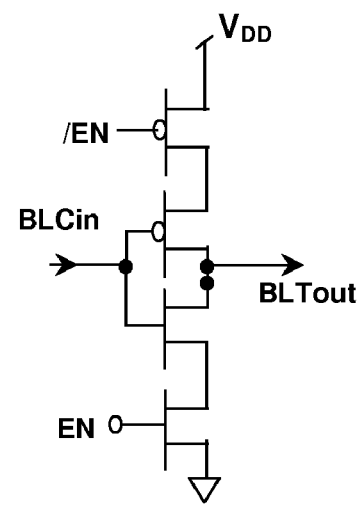
FIG. 2D is a schematic diagram depicting details of a tri-state inverter as can be used within the memory array of FIG. 1.

FIG. 2D shows another circuit that is a tri-state inverter that can be used in each location of the inverting drive devices and with the addition of an input inverter can also supply the buffer circuit. The circuit of FIG. 2D or a similar circuit is needed if the ring oscillator/delay test circuit is embedded permanently in a production array, as both output rails of each buffer or inverter must be disabled in order to not affect the bitlines.

Figure 3:
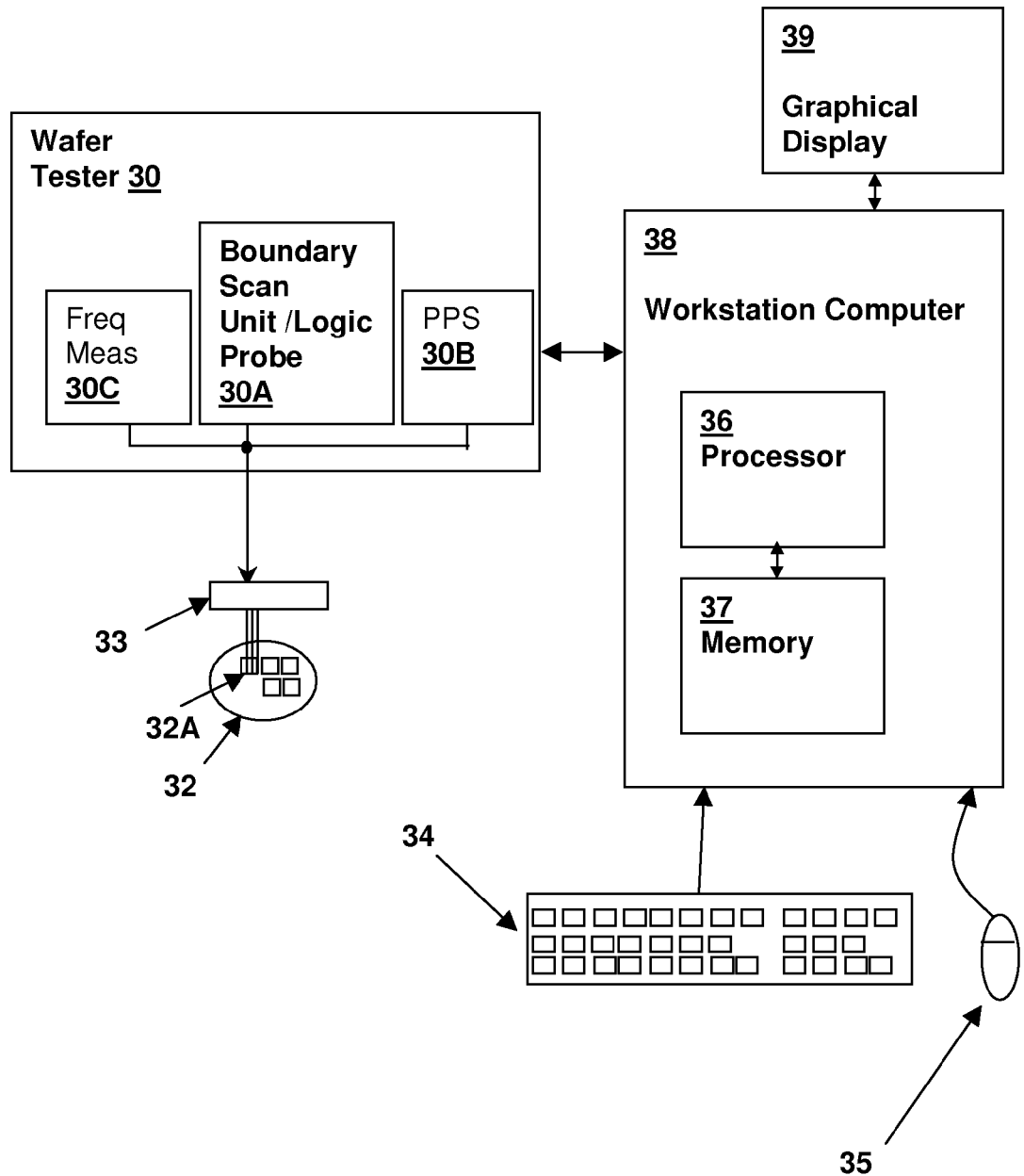
FIG. 3 is a block diagram of a wafer test system for testing a memory array via a method in accordance with an embodiment of the invention.

Referring now to FIG. 3, a VLSI wafer test system, in which methods according to an embodiment of the present invention are performed, is depicted. A wafer tester 30 includes a boundary scan unit 30A for providing stimulus to and retrieving data from a die 32A on a wafer under test 32 via a probe head 33 having electrical test connections to die 32A. Wafer tester 30 includes a frequency or delay measurement unit 30C, that evaluates a frequency of the ring oscillator implemented by the test row of memory cells 10 in conjunction with drive devices I1A,B-B16A,B or measures a delay generated across the test row from assertion of enable signal EN. Wafer tester 30 also includes a programmable power supply 30B for supplying memory cell power supply rail voltage $V_{DD}$ so that the memory cell supply voltage can be varied during testing.

A workstation computer 38, having a processor 36 coupled to a memory 37, for executing program instructions from memory 37, wherein the program instructions include program instructions for receiving data produced by circuits within wafer 32 in accordance with an embodiment of the present invention, is coupled to wafer tester 30. The data produced by embodiments of the present invention are collected from multiple ring oscillator or delay tests of memory cells 10 within dies 32A as one or more of the test memory cell 10A power supply voltages are varied by programmable power supply 30B, and loading/leakage characteristics are changed as described below by using boundary scan unit 30A to read/write test memory cell 10A values and/or connect and disconnect other cells in the other rows to true or complement bitlines to isolate the read versus write delay characteristics of memory cells 10. The results of all of the measurements can then be evaluated to either change the design of the array or memory cells 10, determine whether fabrication process has deviated exceedingly from tolerable norms or to determine operational ranges such as power supply voltage tolerances and access times.

Data from ring oscillator/delay line tests in accordance with embodiments of the invention are transferred to workstation computer 38 via wafer tester 30 and stored in memory 37 and/or other media storage such as a hard disk. Workstation computer 38 is also coupled to a graphical display 39 for displaying program output such as the results of memory tests described hereinafter. Workstation computer 38 is further coupled to input devices such as a mouse 35 and a keyboard 34 for receiving user input. Workstation computer may be coupled to a public network such as the Internet, or may be a private network such as the various "intra-nets" and software containing program instructions for analyzing data produced by methods and circuits in accordance with embodiments of the present invention may be located on remote computers or locally within workstation computer 38. Further, workstation computer 38 may be coupled to wafer tester by such a network connection.

While the system of FIG. 3 depicts a configuration suitable for sequential test of a plurality of dies on a wafer, the depicted system is illustrative and not limiting to the present invention. Probe head 33 may be a multi-die full wafer probe system, or may comprise multiple probe heads for simultaneously testing multiple wafers on a single or multiple die basis. Additionally, while boundary data retrieval and stimulus is illustrated, the techniques of the present invention may also be applied to other interfaces available to probe wafer 32, or applied to circuits implemented in fully functional dies where data extraction is performed over a serial or parallel bus or other interface.

Figure 4:
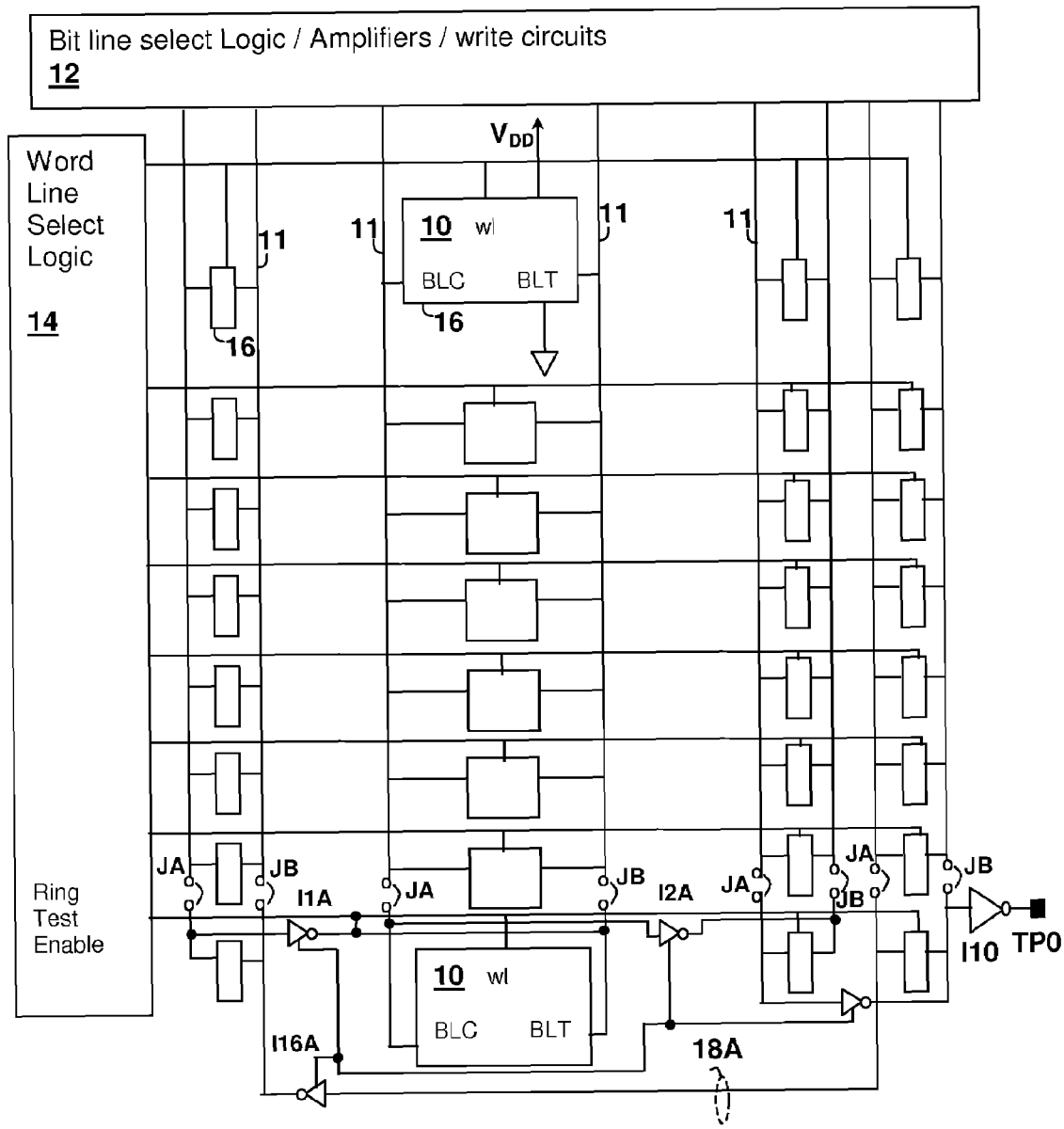
FIG. 4 is a schematic diagram of a memory array in accordance with another embodiment of the invention.

Referring now to FIG. 4, a memory array in accordance with another embodiment of the present invention is depicted. The depicted embodiment is similar to the array of FIG. 1 and therefore only differences between them will be described below. In the memory array of FIG. 4, drive devices I1B-I16B are omitted as mentioned above, providing a single-ended configuration. A set of "jumpers" JA, JB is provided for each column and represent either sacrificial metal, specific hardwired embodiments of the array, or a transmission gate enabled by an external or registered signal. The transmission gate embodiment is only for production arrays in which an electronically selectable test mode is needed that includes the test features described below.

The presence or absence of either set of jumpers JA and/or JB determines the column loading provided by rows other than the test row. As shown, jumpers JA connect other rows of memory cells 10 to the bitlines that receives their input only from memory cells 10, while jumpers JB connect other rows of memory cells 10 to the bitlines that receive their input from drive devices I1A-I16A. Since the drive devices are simulating a write into memory cells 10 and the memory cell outputs are simulating a read onto the bitlines, by removing jumpers JB slow writes are eliminated, and the strength of the read operation from the cell dominates the variation in the measured delay or frequency from baseline data. Removal of jumpers JA eliminates the effect of slow reads on the measured delay or frequency and therefore provides a mechanism for measuring the write strength of memory cells 10. When both JA and JB are present, the circuit operates as described above for a single-ended configuration of the circuit of FIG. 1, and it may be useful to gather data when both JA and JB are absent to determine the extent of the loading on variation. Leakage effects of loading can also be explored for configurations in which either of JA and JB are present, by adjusting the stored values in the non-enabled memory cells 10 in rows other than the test row. The output of the ring oscillator is provided at a test pad TP0, through an inverter I10.

A differential or double-ended configuration of the modified circuit of FIG. 4 can be implemented, but due to the cross-over configuration, loading of alternate bitlines (true or complement) on adjacent columns is required so that the read and write delays are isolated.

Figure 5A:
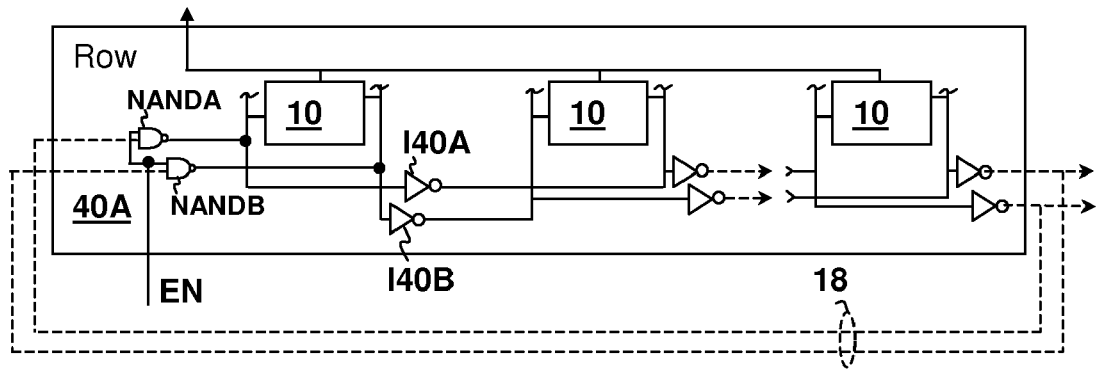
FIGS. 5A-5C are schematic diagrams depicting other ring/delay configurations in accordance with other embodiments of the present invention.

Referring now to FIG. 5A, another ring oscillator/delay line circuit type is illustrated. The illustrated circuit depicts a row 40A similar to that disclosed in FIG. 1 and may also be implemented in circuits such as that of FIG. 4. In row 40A, a single enable stage is implemented by logical NAND gates NANDA and NANDB and the remainder of the memory cells 10 in row 40A are coupled via inverters, e.g., I40A,B. For a "one-shot" delay circuit, the inputs of NANDA and NANDB are both connected to the EN input (or EN and the positive rail) or a ring oscillator is implemented as shown by loopback return connection 18, which may be provided through a second sub-array as shown in FIG. 1.

Figure 5B:
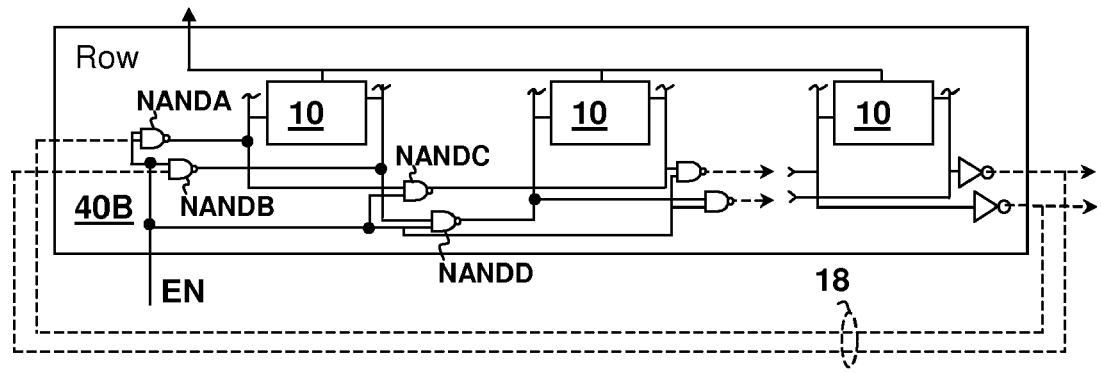

FIG. 5B shows yet another alternative row 40B implementation using NAND gates NANDA, NANDB, NANDC, NANDD and so forth to provide an enable at each stage, similar to that shown using tri-state inverters in the circuit of FIG. 1. The wordline select inputs can be permanently enabled if the circuit is not embedded in a production memory array. Otherwise, row 40B will be disabled in a manner similar to that illustrated with respect to FIG. 1, in which the other rows can provide standard memory functionality when the test circuit is disabled.

Figure 5C:
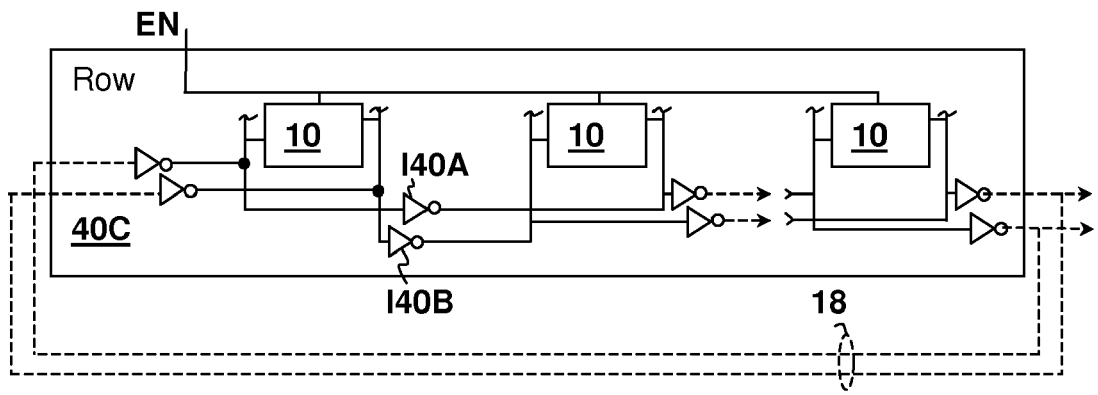

FIG. 5C shows another row 40C embodiment in which a ring or delay line is constructed using inverters (e.g., I40A,B) only, and wherein the circuit is enabled using the wordline select inputs of memory cells 10.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method for measuring characteristics of a memory array, said method comprising:
    enabling a cascade of memory cells of a particular row of said memory array, by providing and connecting a drive device between a bitline of each column and a complementary bitline of a next column;
    propagating at least one state transition from a first column of said memory array through a last column of said memory array, wherein the enabling further maintains wordline inputs of the memory cells in a plurality of columns of the memory array in an enabled state while the at least one state transition is propagating, whereby a delay of the at least one state transition is independent of a memory cell access device enablement delay of the memory cells in the particular row; and
    observing a result of the delay of the at least one state transition, whereby delay performance of said memory cells is determined.

2. The method of claim 1, wherein said propagating propagates said at least one state transition on each pair of bitlines and wherein a state change each one of each pair of bitlines is enforced on complementary bitlines of the next pair of bitlines via cross-coupling of said cascade between adjacent bitlines.

3. The method of claim 1, wherein said propagating further propagates the at least one state transition from a last bitline of said memory array to a complementary first bitline of said memory array, whereby said cascade forms a ring oscillator, and wherein said observing observes an oscillating frequency of said ring oscillator.

4. The method of claim 1, wherein said propagating comprises inserting said at least one state transition at a bitline of said first column of said memory array, and wherein said observing observes a delay between said state transition occurring at a last column of said memory array and said inserting.

5. The method of claim 1, wherein said propagating is performed between bitlines by a circuit that has a strength for a first transition direction set in conformity with a strength of a bitline pre-charge device, whereby a normal read condition is simulated by said propagating.

6. The method of claim 1, wherein said propagating is performed between bitlines by a circuit that has a strength for a first transition direction set in conformity with a strength of a bitline write discharge device, whereby a normal write condition is simulated by said propagating.

7. The method of claim 1, further comprising asymmetrically loading said bitlines by connecting memory cells in other rows of said memory away to only one of non-complement bitlines and complement bitlines, whereby one of a read or write operation dominates said observed delay result.

8. The method of claim 1, further comprising loading said bitlines to simulate normal memory operating conditions by connecting memory cells in other rows of said memory away to only both non-complement bitlines and complement bitlines.

* * * * *